United States Patent
Rasche

[11] Patent Number: 5,823,959
[45] Date of Patent: Oct. 20, 1998

[54] MR METHOD FOR DETERMINING THE MAGNETIC FIELD INHOMOGENEITY IN AN EXAMINATION ZONE, AND MR APPARATUS FOR CARRYING OUT THE METHOD

[75] Inventor: Volker Rasche, Hamburg, Germany

[73] Assignee: U.S. Philips Corporation, New York, N.Y.

[21] Appl. No.: 795,489

[22] Filed: Feb. 5, 1997

[30] Foreign Application Priority Data

Feb. 8, 1996 [DE] Germany ................. 196 04 519.3

[51] Int. Cl.[6] .................................................. A61B 5/055
[52] U.S. Cl. .......................... 600/410; 324/309; 324/320
[58] Field of Search ........................ 128/653.2; 324/307, 324/309, 318, 320; 600/410

[56] References Cited

U.S. PATENT DOCUMENTS

| | | | |
|---|---|---|---|
| 4,797,615 | 1/1989 | Rotem et al. | 324/309 |
| 4,896,113 | 1/1990 | Pelc | 324/309 |
| 4,987,371 | 1/1991 | Glover et al. | 324/320 |
| 5,168,232 | 12/1992 | Glover et al. | 324/320 |
| 5,307,808 | 5/1994 | Dumoulin | 128/635.2 |
| 5,539,289 | 7/1996 | van der Meulen | 324/320 |
| 5,539,316 | 7/1996 | Sukumar | 324/320 |
| 5,587,658 | 12/1996 | Sukumar | 324/309 |
| 5,617,029 | 4/1997 | Schneider | 324/320 |

FOREIGN PATENT DOCUMENTS

| | | |
|---|---|---|
| 0073671A1 | 3/1983 | European Pat. Off. . |
| 0240319A2 | 10/1987 | European Pat. Off. ....... G01N 24/08 |
| 0465139A2 | 1/1992 | European Pat. Off. . |
| 3422688A1 | 1/1985 | Germany . |

OTHER PUBLICATIONS

"Fast Magnetic Resonance Imagin with Simultaneously Oscillating and Rotating Field Gradients" Stephen J. Norton, IEEE Transactions on Medical Imaging, vol. MI–6, No. 1, Mar. 1987, pp. 21–31.

*Primary Examiner*—Marvin M. Lateef
*Assistant Examiner*—Shawna J. Shaw
*Attorney, Agent, or Firm*—Dwight H. Renfrew, Jr.

[57] ABSTRACT

The invention relates to an MR method for determining the frequency map in an examination zone as well as to an appropriate sequence in which the nuclear magnetization is read in conjunction with the read gradient of varying direction. Subsequent to an excitation of the nuclear magnetization, a plurality of MR echo signals are acquired. From the sub-images acquired with different echo times on the one hand the frequency map can be derived whereas on the other hand these sub-images can be combined so as to form an MR overall image of higher spatial resolution. The invention also relates to a device for carrying out this method.

9 Claims, 2 Drawing Sheets

MR METHOD FOR DETERMINING THE MAGNETIC FIELD INHOMOGENEITY IN AN EXAMINATION ZONE, AND MR APPARATUS FOR CARRYING OUT THE METHOD

BACKGROUND OF THE INVENTION

1. Field of the Invention

The invention relates to an MR method in which a frequency map which represents the magnetic field inhomogeneity in an examination zone is derived from at least two MR images of the examination zone, exposed to a steady magnetic field, which MR images have been acquired with different echo times. A method of this kind is known from EP-A-465 139.

2. Description of the Related Art

For the image quality achieved during MR (magnetic resonance) examinations it is essential that the steady magnetic field in the examination zone is as homogenous as possible. Therefore, MR apparatus are provided with so-called shim coils for locally varying the steady magnetic field generated by a main field magnet. The inhomogeneity of the steady magnetic field generated in the examination zone by the main field magnet can be reduced by suitable adjustment of the currents in the shim coils. As is known from EP-A-465 139, first-order shim fields can also be generated by means of the gradient coils which are required anyway for the imaging in an MR apparatus, whereas higher-order shim fields can be generated only by the actual shim coils.

In the known system the currents through the shim coils are adjusted in dependence on a previously measured frequency map or homogeneity map representing the magnetic field inhomogeneity in the examination zone. The inhomogeneity of the magnetic field is also influenced by local variations of the magnetic susceptibility within the object to be examined in the examination zone. Therefore, the frequency map must be determined anew not only when another patient is examined, but also when different parts of the same patient are to be examined.

According to the known method the frequency map is derived from two MR images which are reconstructed from MR signals acquired in an identical manner but with different echo times. Even if the spatial resolution of these MR images is less than that of the MR images formed during the actual MR examination, during various MR examinations the time required for the acquisition of these MR images is not available. For example, in the case of interventional MR examinations the position of the examination zone changes continuously, so that the frequency map would have to be continuously updated; thus far this was not possible because two MR images had to be acquired for this purpose each time.

SUMMARY OF THE INVENTION

Therefore, it is an object of the present invention to conceive an MR method of the kind set forth which enables faster acquisition of the two MR images. This object is achieved according to the invention in that a) the nuclear magnetization in the examination zone is excited by at least one respective RF pulse in a plurality of sequences, b) after each excitation of the nuclear magnetization at least two MR echo signals are acquired along paths in the k-space which pass through the zero point of the k-space, preferably in different directions, c) MR echo signals which pass through the zero point of the k-space in different directions in different sequences and have been acquired at the same temporal distance from the excitation of the nuclear magnetization are combined so as to form groups, d) a respective MR image is reconstructed from the MR echo signals of at least two groups, and e) the frequency map is derived from at least two of these MR images.

According to the invention, after each excitation of the nuclear magnetization at least two MR echo signals are acquired along paths in the k-space which pass through the zero point of the k-space, preferably in different directions. Therefore, these MR echo signals also have different echo times. An MR image is derived from the MR echo signals acquired with the same echo time in different sequences, resulting in a plurality of MR images with different echo times. The frequency map can then be derived in known manner from two MR images. The reduction of the time required for the acquisition of the MR echo signals already follows from the fact that at least two MR echo signals are acquired after each excitation.

A further reduction is achieved in a preferred embodiment of the invention in which the MR method is carried out so that the MR images derived from the individual groups are superposed so as to form an MR overall image. The actual MR examination is thus performed with the aid of the MR overall image thus obtained, so that the acquisition of the MR images wherefrom the frequency map is derived does not require an additional examination time. This is important, notably if the frequency map is to be continuously updated. A condition in this respect is that the MR echo signals acquired within a sequence pass through the zero point of the k-space in respective different directions. The MR images reconstructed from the MR echo signals of individual groups have a spatial resolution which is less than that of the MR overall image intended for the actual MR examination. However, its resolution suffices because the local variation of the steady magnetic field is only comparatively slow.

In a further embodiment of the invention, shim coils and/or a gradient coil system are provided for local variation of the steady magnetic field, and the currents through the shim coils and/or the gradient coil system are controlled in dependence on the frequency map determined. As has already been stated, the gradient coils are also capable of generating (first-order) magnetic shim fields. If the position of the examination zone changes continuously during an MR examination, in a further version of the invention special advantages are obtained in that the sequences act continuously on the examination zone and the currents through the shim coils and/or the gradient coil system are continuously controlled in dependence on the frequency map determined. This is important notably for interventional MR examinations.

An MR method in which the nuclear magnetization in the examination zone is excited by at least one respective RF pulse during at least one sequence and in which, after each excitation of the nuclear magnetization, a plurality of MR echo signals are acquired along paths in the k-space which pass through the zero point of the k-space in different directions is known per se from an article by Norton in IEEE Trans. Med. Imaging, Vol. MI-6, pp. 21–31. Therein, the MR echo signals are acquired along a path in the k-space which oscillates about the zero point of the k-space while slowly changing its direction. The paths in the k-space then describe a pattern which resembles the petals grouped around a flower stem, which is why this method is called a "flower scan" by some experts. The advantage of this method over the projection-reconstruction method known from EP-B 73 671 resides in the fact that, at least in theory, the MR echo signals required for the reconstruction of an MR image can be generated by a single excitation of the nuclear magnetization in the examination zone. The drawback with respect to the method disclosed in EP-B 73 671 consists in that the paths in the k-space are not straight, so that the reconstruction of the MR images from the MR echo signals is comparatively complex.

A method of the kind set forth which combines the advantages of both known methods (straight scanning paths and always a plurality of echo signals after an excitation of the nuclear magnetization) consists in that during the acquisition of each MR echo signal a constant read gradient is generated so that the MR echo signals are acquired in the k-space along a straight line passing through the zero point thereof, the read gradients generated during the acquisition of the various MR signals have a different direction so that the straight lines intersect at the zero point of the k-space, between the read gradients switched within a sequence there are intervals in which magnetic gradient fields are applied whose variation in time is such that in the k-space a shift occurs from the end point of the straight line along which the preceding MR echo signal has been acquired to the starting point of the straight line along which the next MR echo signal is acquired.

This method can be advantageously used for acquiring the MR images for the frequency map; however, it can also be used independently thereof because it substantially reduces the time required for the acquisition of the MR echo signals in comparison with the customary projection-reconstruction method.

An MR device for carrying out the MR method for deriving the frequency map includes a magnet for generating a homogeneous, steady magnetic field, a gradient coil system for generating a magnetic gradient field whose gradient can be varied in respect of magnitude and/or direction, at least one RF coil system for generating RF pulses and for receiving MR echo signals, means for generating MR images from the MR echo signals and for deriving a frequency map from two MR images acquired with different echo times, a programmable control unit for controlling said means and the coil systems.

This control unit is programmable in such a manner that
a) the nuclear magnetization in the examination zone is excited by at least one respective RF pulse in a plurality of sequences,
b) after each excitation of the nuclear magnetization at least two MR echo signals are acquired along paths in the k-space which pass through the zero point of the k-space, in preferably in different directions,
c) MR echo signals which pass through the zero point of the k-space in different directions in different sequences and have been acquired at the same temporal distance from the excitation of the nuclear magnetization are combined so as to form groups,
d) a respective MR image is reconstructed from the MR echo signals of at least two groups, and
e) the frequency map is derived from at least two of these MR images.

Using such an MR device, the preferred MR sequences according to the invention can be generated in that the control unit is programmed so that in at least one sequence the nuclear magnetization in the examination zone is excited by at least one respective RF pulse and after each excitation of the nuclear magnetization a plurality of MR echo signals are acquired along paths in the k-space which pass through the zero point of the k-space in different directions, during the acquisition of each MR echo signal a constant read gradient is generated so that the MR echo signals are acquired in the k-space along a straight line extending through the zero point thereof, the read gradients generated during the acquisition of the various MR signals have a different direction so that the straight lines intersect at the zero point at the k-space, between the read gradients switched within one sequence there are intervals in which magnetic gradient fields are applied whose variation in time is such that in the k-space a shift occurs from the end point of the straight line along which the preceding MR echo signal has been acquired to the starting point of the straight line along which the next MR echo signal is acquired.

BRIEF DESCRIPTION OF THE DRAWING

The invention will be described in detail hereinafter with reference to the drawings. Therein.

DETAILED DESCRIPTION OF THE PREFERRED EMBODIMENTS

Figure 1:
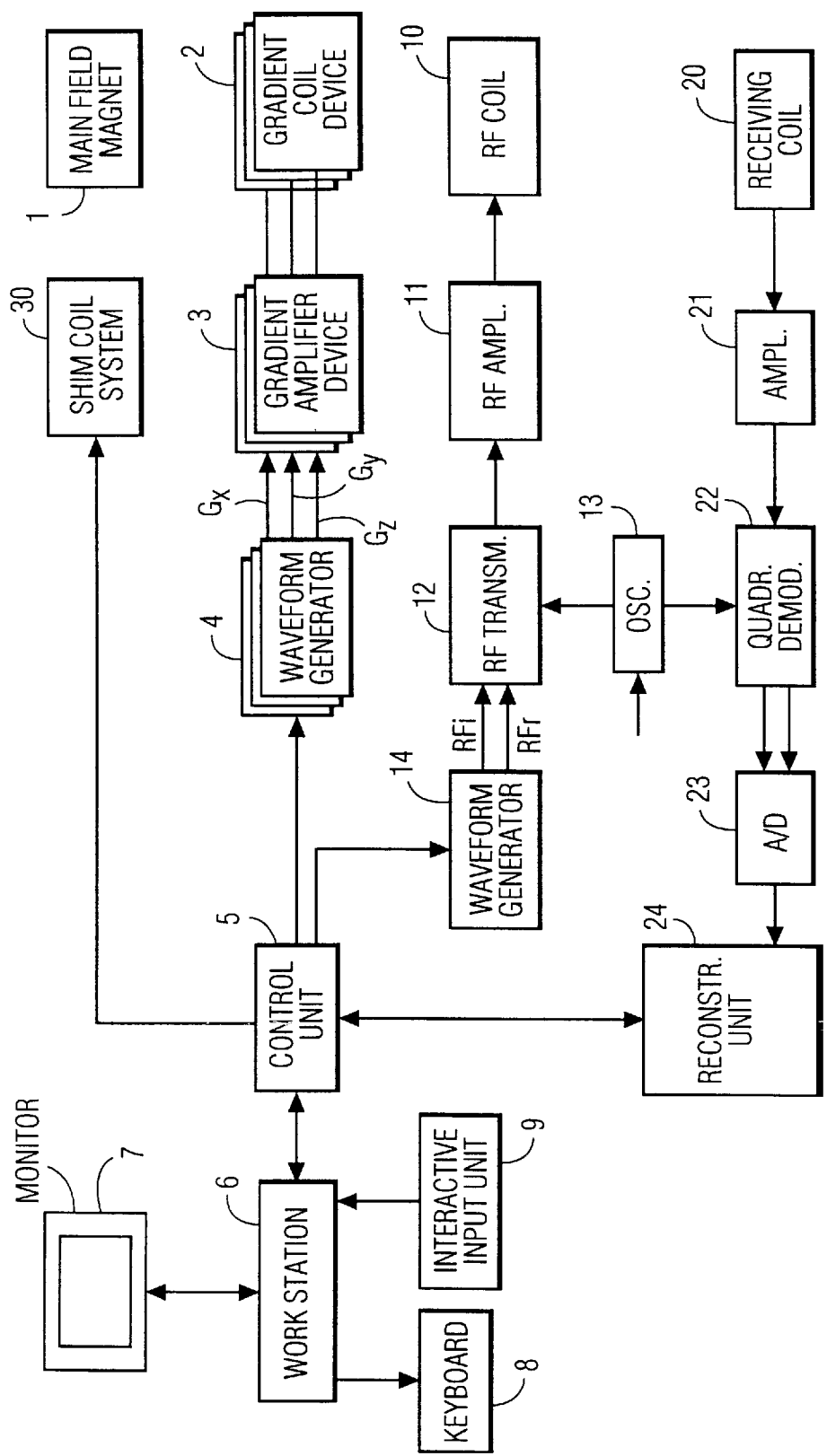
FIG. 1 shows the block diagram of the MR apparatus whereby the invention can be carried out.

The reference numeral 1 in FIG. 1 denotes a main field magnet which generates (in an examination zone not shown) a steady, essentially homogenous magnetic field which extends in the z-direction and has a strength of, for example 1.5 Tesla. There is also provided a shim coil system 30 which enables variation of the magnet field in the examination zone in dependence on the currents flowing through the shim coils, that is to say in such a manner that the resultant magnetic field is more homogeneous overall. The shim coil system 30, enabling higher-order shim fields to be generated, is controlled by a control unit 5.

There is also provided a gradient coil system 2 which is capable of generating magnetic gradient fields $G_x$, $G_y$ and $G_z$ which extend in the z-direction in the examination zone and have a gradient in the x, the y or the z-direction. The gradient coil system 2 is fed by a gradient amplifier device 3. The variation in time of the magnetic gradient fields is predetermined by a waveform generator 4 which is controlled by the control unit 5. The control unit 5 cooperates with a workstation 6. The workstation includes a monitor 7 for the display of MR images. Entries can be made via a keyboard 8 or an interactive input unit 9, for example a light pen.

The nuclear magnetization in the examination zone can be excited by RF pulses from an RF coil 10 which is connected to an RF amplifier 11 which amplifies the output signals of an RF transmitter 12. In the RF transmitter the envelopes of an RF pulse are modulated with carrier oscillations supplied by an oscillator 13 whose frequency corresponds to the Larmor frequency (approximately 63 MHz for a main field of 1.5 Tesla). The control unit 5 loads the envelope into a waveform generator 14 which is coupled to the transmitter 12.

The MR signals generated in the examination zone are received by a receiving coil 20 and amplified by an amplifier 21. The amplified MR signal is demodulated in a quadrature demodulator 22 by two 90° offset carrier oscillations of the oscillator 13, so that two signals are generated in the low-frequency range, which signals may be considered as the real part and the imaginary part of a complex MR echo signal. These signals are applied to an analog-to-digital converter 23 which forms MR data therefrom. This data is applied to a reconstruction unit 24 which reconstructs MR images from the MR data in cooperation with the work station, which MR images represent the nuclear magnetization in the examination zone. Each MR image is defined by complex numbers in its individual pixels, representing the absolute value and the phase position or the real part and the imaginary part of the complex nuclear magnetization in the relevant pixel.

Figure 2:
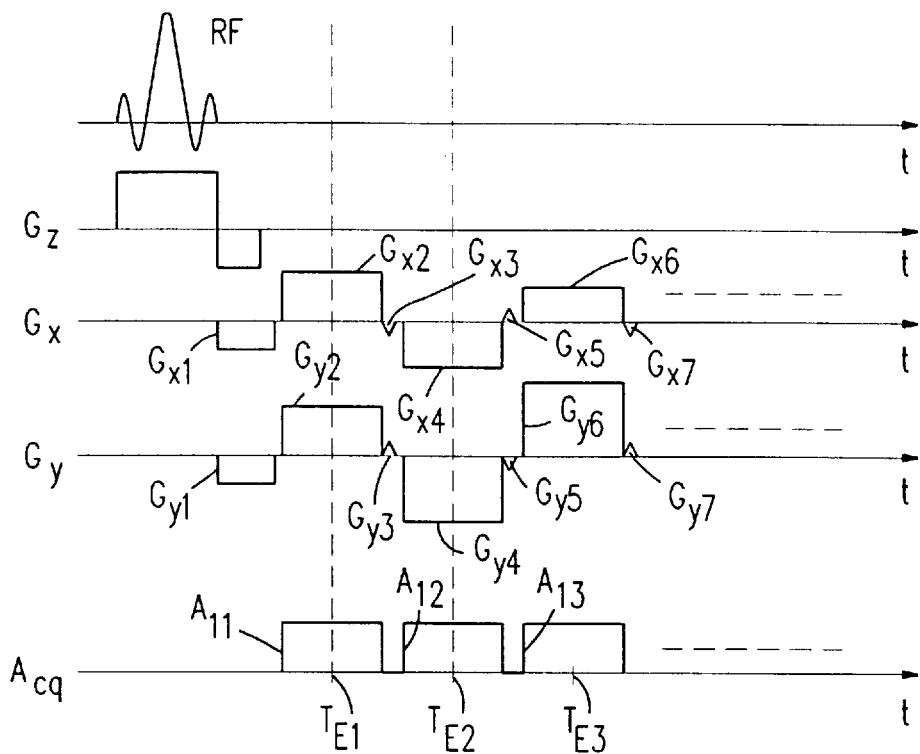
FIG. 2 shows the variation in time of various signals in an MR sequence according to the invention.

As is shown in FIG. 2, each sequence includes an RF pulse RF (first line of FIG. 2) which excites the nuclear magnetization in a slice of the examination zone whose thickness is dependent on the strength of the simultaneously active slice selection gradient $G_z$ (second line of FIG. 2) as well as on the bandwidth of the RF pulse RF. Subsequent to the RF pulse RF, a magnetic gradient field $G_{x1}$, $G_{y1}$ (third and fourth lines of FIG. 2) having a gradient acting in the x-direction and the y-direction, respectively, is switched on and off so that the nuclear magnetization is dephased to a maximum value in the k-space which forms the starting point of a path $P_{11}$ in the k-space. As is known, the k-values $k_x$ and $k_y$ correspond to the time integral over $G_x$, and $G_y$, respectively.

Subsequently, the read gradients $G_{x2}$ and $G_{y2}$ are switched; their time integral amounts to twice that of $G_{x1}$ and $G_{y1}$ and they have the opposite polarity relative to $G_{x1}$ and $G_{y1}$. For as long as the gradients $G_{x2}$ and $G_{y2}$ are active, an MR signal is acquired as denoted by the reference $A_{11}$ on the fifth line of FIG. 2. The MR echo signal is then acquired along the path $P_{11}$ which, starting from the starting point, passes through the zero point of the k-space at an angle $\theta_0$ and then reaches an end point whose distance from the zero point of the k-space exactly equals that between the zero point and the starting point.

The MR method described thus far corresponds to the projection-reconstruction method known from EP-A 73-671. However, whereas subsequent to the acquisition of an MR echo signal along the path $P_{11}$ in the known method the nuclear magnetization in the slice is excited again by an RF pulse and the MR echo signal thus produced is read along a path which extends through the k-space at an angle which deviates from that during the acquisition of the first MR echo signal, according to the method of the invention at least one further MR echo signal is acquired, but preferably a plurality of echo signals, which pass through the zero point of the k-space in respective different directions.

Therefore, subsequent to the gradients $G_{x2}$ and $G_{y2}$, gradients $G_{x3}$ and $G_{y3}$, respectively, are briefly switched on and off (so-called blips), their time integral being small in comparison with the time integral over $G_{x2}$ and $G_{y2}$, respectively. Consequently, a shift from the end point of the path $P_{11}$ to the starting point of the path $P_{12}$ occurs in the k-space (FIG. 3), as denoted by the arrow $h_1$ in FIG. 3.

Subsequently, there is switched a read gradient having the components $G_{x4}$ and $G_{y4}$, corresponding to the read gradients $G_{x2}$, $G_{y2}$ in respect of absolute value but having the opposite polarity with respect thereto. The direction in the k-space of the path $P_{12}$ associated with this gradient is such that it passes through the zero point while intersecting the path $P_{11}$ at an angle $d\theta$. The MR echo signal occurring during the read gradient $G_{x4}$, $G_{y4}$ is acquired in the time interval $A_{12}$ (fifth line of FIG. 2). Therein, $d\theta$ is the angular increment required for a given spatial resolution.

Subsequently, blips $G_{x5}$, $G_{y5}$ are switched again, after which the MR signal is read by means of the read gradients $G_{x6}$, $G_{y6}$, during the time interval $A_{13}$, along a path (not shown in FIG. 3) which extends at an angle $d\theta$ with respect to the path $P_{12}$. n MR echo signals are thus read subsequent to an excitation of the nuclear magnetization by the RF pulse RF, the last MR echo signal being acquired along the path $P_{1n}$ (FIG. 3). n must be smaller than $360°/d\theta$ and may have a value of between 4 and 16.

Figure 3:
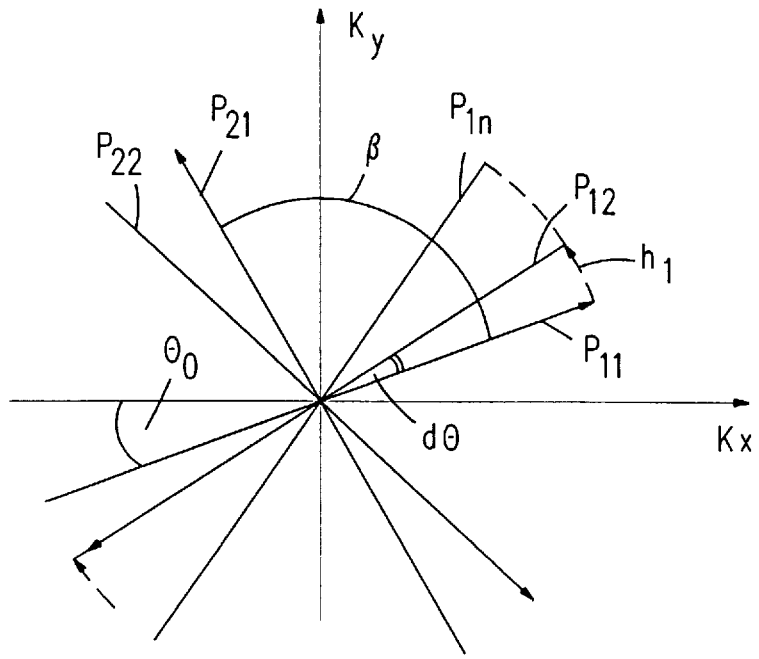
FIG. 3 shows the position of the paths in the k-space along which the MR echo signals are acquired in this sequence.

Subsequently, the nuclear magnetization in the previously excited slice is excited again by an RF pulse, after which n MR echo signals are acquired again. The variation in time of the gradient fields $G_x$ and $G_y$ in this sequence, however, is chosen so that the MR echo signals are acquired along paths $P_{21}$, $P_{22}$ etc. which enclose an angle $\beta$ with respect to the paths $P_{11}$, $P_{12}$ as shown in FIG. 3. Subsequently, further sequences are applied in which MR echo signals are acquired along further paths through the k-space until the k-space has been scanned along uniformly offset (by the angular increment $d\theta$) paths.

For the embodiment described with reference to the FIG. 3 in conjunction with FIG. 2 it was assumed that the paths in the k-space along which the MR echo signals are acquired extend symmetrically relative to the zero point of the k-space, the start of each path being situated exactly at the same distance from the zero point as its end. However, the path can alternatively start or end at the zero point. For example, if a path starts at the zero point of the k-space, it ends at a distance therefrom, for example like $P_{11}$ in FIG. 3. After a shift over $h_1$ (FIG. 3), the reception takes place of the next MR echo signal along a path which starts, for example like $P_{12}$, outside but terminates at the zero point of the k-space. The subsequent MR echo signal is acquired again along a path which starts from the zero point again, be it at a different angle.

The variation of the magnetic gradient fields $G_x$, $G_y$ must then be modified as follows: $G_{x1}$ and $G_{y1}$ are omitted. The time integral over the read gradients $G_{x2}$ . . . $G_{x6}$ and $G_{y2}$ . . . $G_{y6}$ amounts to only half of that in FIG. 2. Every second blip (for example, $G_{x5}$ and $G_{y5}$) can be omitted, because the one path commences at the same point at which the previous path has ended (i.e. at the zero point).

During the processing of the MR echo signals the MR echo signals which have been acquired with the same echo time, i.e. at the same temporal distance from the RF pulse, are combined. A first group is then formed from the MR echo signals which have been acquired along the paths $P_{11}$, $P_{21}$ . . . etc in the time interval $A_{11}$ of each sequence. A second group comprises the MR echo signals acquired along the paths $P_{12}$, $P_{22}$ etc., and the $n^{th}$ group comprises the MR signals acquired along the path $P_{1n}$ and the corresponding paths in the other sequences. A given echo time can be assigned to each group, for example, to the respective first MR echo signals measured (along the paths $P_{11}$, $P_{21}$ etc.) the echo time $T_{E1}$ (coinciding with the center of the read interval $A_{11}$), and subsequently the echo time $T_{E2}$ to the MR echo signals acquired in the interval $A_{12}$, etc. From the MR echo signals of each group a respective (sub-)MR image of low resolution can be reconstructed. These (sub-)MR images can be used to a) reconstruct a high-resolution MR overall image, or b) to derive the frequency map in the slice.

a) Because of inevitable deviations between the Larmor frequency of the nuclear magnetization and the frequency whereto the oscillator 13 (FIG. 1) is tuned, the sub-images have a phase error so that artefacts would occur if the MR images from the individual groups of MR echo signals were directly combined to form an MR overall image. These phase errors are proportional to the echo time applicable to the relevant group of MR signals and can be simply derived for each (sub-)MR image from the spatial mean value of the phase in the individual pixels of the relevant MR image. Said phase errors can be compensated by multiplying all pixels of the MR image by a corresponding phase factor. The MR images (of low spatial resolution) thus phase-compensated can then be combined so as to form an MR overall image of higher spatial resolution, without giving rise to the described image artefacts.

b) The (sub-)MR images reconstructed from the individual groups of MR echo signals deviate merely in respect of the echo times ($T_{E1}$) and ($T_{E2}$). Therefore, the frequency map can be derived from two of such MR images as described in EP-OS 465 139. Subsequently, the complex MR image values associated with the respective same MR image pixel are divided by one another, resulting in a complex MR image whose phase in one pixel corresponds to the phase difference in the relevant pixel of the images wherefrom it is derived. The distance in time between the MR echo signals wherefrom the two MR images are derived must then be so small that the maximum phase difference occurring is less than $\pm\pi(180°)$. This is necessary in order to preclude ambiguity which is also feasible in practice. If the phase thus obtained for each pixel is divided by the difference T between the echo times ($T=T_{E1}-T_{E2}$), the frequency map is obtained which indicates to what extent the frequency in the individual pixels deviates from a mean value due to the magnetic field inhomogeneities.

Because of the linear relationship between the Larmor frequency and the strength of the magnetic field, the frequency map is a direct measure of the inhomogeneity of the magnetic field. Therefore, the shim fields whereby the inhomogeneity of the magnetic field in the slice examined can be reduced can be calculated from the frequency map. If a restriction is made to first-order shim fields and the currents required for this purpose are generated in the gradient coil system 2, the shim coil system 3 can be dispensed with. These currents, being constant during the examination, are calculated by the control unit 5 or the generator device 4 on the basis of the frequency map, after which they are superposed on the temporally varying currents for imaging and applied to the gradient amplifier device. If higher-order shim fields are also required, it is necessary to utilize the shim coils 30; the value of the currents to be adjusted therein is calculated by the control unit 5. Because the frequency map can thus be continuously updated in accordance with the invention, without interrupting the actual MR examination, the adjustment of the shim fields can be continuously adapted to the changing circumstances.

I claim:

1. An MR method in which a frequency map which represents magnetic field inhomogeneity in an examination zone is derived from at least two MR images of the examination zone, exposed to a steady magnetic field, which MR images have been acquired with different echo times, comprising:

a) exciting nuclear magnetization in the examination zone by at least one respective RF pulse (RF) in a plurality of sequences, b) after each excitation of the nuclear magnetization acquiring at least two MR echo signals along paths in the k-space which reach or emanate from the zero point of the k-space, c) combining MR echo signals which have been acquired along paths which reach or emanate from the zero point of k-space in different directions in different sequences and have been acquired at the same temporal distance from the excitation of the nuclear magnetization so as to form groups, each group being of MR echo signals acquired at a different temporal distance from the excitation of nuclear magnetization, d) reconstructing a plurality of MR images from the MR echo signals of respective different individual groups, and e) deriving the frequency map from at least two of the plurality of MR images.

2. An MR method as claimed in claim 1, wherein the MR images derived from the individual groups are superposed so as to form an MR overall image.

3. An MR method as claimed in claim 1, wherein for local variation of the steady magnetic field, currents through shim coils and/or a gradient coil system are controlled in dependence on the frequency map determined.

4. An MR method as claimed in claim 3, in which the position of the examination zone is continuously changed, wherein the sequences act continuously on the examination zone and the currents through the shim coils and/or the gradient coil system are controlled continuously in dependence on the frequency map determined.

5. An MR method as claimed in claim 1, wherein the nuclear magnetization in the examination zone is excited by at least one respective RF pulse during at least one sequence and in which, after each excitation of the nuclear magnetization, a plurality of MR echo signals are acquired along paths in k-space which reach or emanate from the zero point of k-space in different directions, and wherein:

during the acquisition of each MR echo signal a constant read gradient is generated so that the MR echo signals are acquired in k-space along a straight line passing through the zero point thereof, read gradients generated during the acquisition of the various MR signals have a different direction so that the straight lines intersect at the zero point of k-space, and between the read gradients switched within a sequence there are intervals in which magnetic gradient fields are applied whose variation in time is such that in k-space a shift occurs from the end point of the straight line along which the preceding MR echo signal has been acquired to the starting point of the straight line along which the next MR echo signal is acquired.

6. An MR device comprising:

a magnet for generating a homogeneous, steady magnetic field in an examination zone, a gradient coil system for generating a magnetic gradient field in the examination zone whose gradient can be varied in respect of magnitude and/or direction, at least one RF coil system for transmitting RF pulses into and for receiving MR echo signals from the examination zone, means for generating MR images from the MR echo signals and for deriving a frequency map from two MR images acquired with different echo times, a programmable control unit for controlling said means and the coil systems, wherein the control unit can be programmed in such a manner that:

a) nuclear magnetization in the examination zone is excited by at least one respective RF pulse in a plurality of sequences, b) after each excitation of the nuclear magnetization at least two MR echo signals are acquired along paths in the k-space which reach or emanate from the zero point of the k-space, c) MR echo signals which reach or emanate from the zero point of the k-space in different directions in different sequences and have been acquired at the same temporal distance from the excitation of the nuclear magnetization are combined so as to form groups, each group being of MR echo signals acquired at a different temporal distance from the excitation of nuclear magnetization, d) a plurality of MR images are reconstructed from the MR echo signals of respective different individual groups, and e) the frequency map is derived from at least two of the plurality of MR images.

7. An MR device comprising:

a magnet for generating a homogeneous, steady magnetic field in an examination zone, a gradient coil system for generating a magnetic gradient field in the examination zone whose gradient can be varied in respect of magnitude and/or direction, at least one RF coil system for transmitting RF pulses into and for receiving MR echo signals from the examination zone, means for generating MR images from the MR echo signals and for deriving a frequency map which represents the magnetic field inhomogeneity in the examination zone from at least two MR images of the examination zone, exposed to a steady magnetic field, which MR images have been acquired with different echo times, a programmable control unit for controlling said means and the coil systems, wherein the control unit is programmed in such a manner that:

in at least one sequence the nuclear magnetization in the examination zone is excited by at least one respective RF pulse and after each excitation of the nuclear magnetization a plurality of MR echo signals are acquired along paths in k-space which reach or emanate from the zero point of k-space in different directions, during the acquisition of each MR echo signal a constant read gradient is generated so that the MR echo signals are acquired in k-space along a straight line extending through the zero point thereof, the read gradients generated during the acquisition of the various MR signals have a different direction so that the straight lines intersect at the zero point of k-space, and between the read gradients switched within one sequence there are intervals in which magnetic gradient fields are applied whose variation in time is such that in k-space a shift occurs from the end point of the straight line along which the preceding MR echo signal has been acquired to the starting point of the straight line along which the next MR echo signal is acquired.

8. An MR method as claimed in claim 2, wherein for local variation of the steady magnetic field, currents through shim coils and/or a gradient coil system are controlled in dependence on the frequency map determined.

9. An MR method as claimed in claim 8, in which the position of the examination zone is continuously changed, wherein the sequences act continuously on the examination zone and the currents through the shim coils and/or the gradient coil system are controlled continuously in dependence on the frequency map determined.

* * * * *